United States Patent
Majnemer et al.

(10) Patent No.: US 11,763,142 B2
(45) Date of Patent: *Sep. 19, 2023

(54) GENERAL PADDING SUPPORT FOR CONVOLUTION ON SYSTOLIC ARRAYS

(71) Applicant: Google LLC, Mountain View, CA (US)

(72) Inventors: David Alexander Majnemer, Mountain View, CA (US); Blake Alan Hechtman, Mountain View, CA (US); Bjarke Hammersholt Roune, Mountain View, CA (US)

(73) Assignee: Google LLC, Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/902,776

(22) Filed: Sep. 2, 2022

(65) Prior Publication Data

US 2022/0414441 A1    Dec. 29, 2022

Related U.S. Application Data

(63) Continuation of application No. 16/548,555, filed on Aug. 22, 2019, now Pat. No. 11,449,739.

(51) Int. Cl.
*G06N 3/063* (2023.01)
*G06N 3/04* (2023.01)
(Continued)

(52) U.S. Cl.
CPC ............ *G06N 3/063* (2013.01); *G06F 17/15* (2013.01); *G06F 17/16* (2013.01); *G06F 30/18* (2020.01);
(Continued)

(58) Field of Classification Search
CPC ........ G06N 3/063; G06N 3/04; G06N 3/0454; G06N 3/06; G06N 3/086; G06N 3/10;
(Continued)

(56) References Cited

U.S. PATENT DOCUMENTS 9,721,203 B1 * 8/2017 Young .................. G06N 3/04
11,449,739 B2 * 9/2022 Majnemer ............ G06F 17/16
(Continued)

FOREIGN PATENT DOCUMENTS

DE       202017105528     12/2017
WO     WO 2019/025864      2/2019
(Continued)

OTHER PUBLICATIONS

Geo et al., "swATOP: Automatically Optimizing Deep Learning Operators on SW26010 Many-Core Processor," Proceedings of the 48th International Conference on Parallel Processing, Aug. 2019, 10 pages.
(Continued)

*Primary Examiner* — Phallaka Kik
(74) *Attorney, Agent, or Firm* — Fish & Richardson P.C.

(57) ABSTRACT

Methods and systems, including computer programs encoded on a computer storage medium. In one aspect, a method includes the actions of receiving a request to perform convolutional computations for a neural network on a hardware circuit having a matrix computation unit, the request specifying the convolutional computation to be performed on a feature tensor and a filter and padding applied to the feature tensor prior to performing the convolutional computation; and generating instructions that when executed by the hardware circuit cause the hardware circuit to perform operations comprising: transferring feature tensor data from a main memory of the hardware circuit to a scratchpad memory of the hardware circuit; and repeatedly performing the following operations: identifying a current subset of the feature tensor; and determining whether a
(Continued)

memory view into the scratchpad memory for the current subset is consistent with a memory view of the current subset in the main memory.

20 Claims, 7 Drawing Sheets

(51) Int. Cl.
*G06N 3/06* (2006.01)
*G06N 3/10* (2006.01)
*G06F 17/15* (2006.01)
*G06F 17/16* (2006.01)
*G06F 30/18* (2020.01)
*G06F 30/20* (2020.01)
*G06F 30/27* (2020.01)
*G06F 30/367* (2020.01)
*G06N 3/086* (2023.01)
*G06N 3/045* (2023.01)

(52) U.S. Cl.
CPC .............. *G06F 30/20* (2020.01); *G06F 30/27* (2020.01); *G06F 30/367* (2020.01); *G06N 3/045* (2023.01); *G06N 3/086* (2013.01); *G06N 3/10* (2013.01)

(58) Field of Classification Search
CPC .......... G06F 17/15; G06F 17/16; G06F 30/18; G06F 30/20; G06F 30/27; G06F 30/367; G06F 19/00
USPC ......... 706/15, 17, 33, 44; 702/109; 703/1, 2, 703/6, 13; 716/136, 111, 106
See application file for complete search history.

(56) References Cited

U.S. PATENT DOCUMENTS

| | | |
|---|---|---|
| 2018/0101483 A1 | 4/2018 | Catthoor et al. |
| 2018/0165574 A1 | 6/2018 | Young |
| 2018/0165577 A1 | 6/2018 | Young |
| 2019/0065942 A1 | 2/2019 | Verrilli et al. |
| 2019/0188866 A1 | 6/2019 | Mehrseresht |
| 2019/0205737 A1 | 7/2019 | Bleiweiss et al. |
| 2019/0294975 A1 | 9/2019 | Sachs |
| 2019/0318245 A1 | 10/2019 | Song |
| 2021/0012102 A1 | 1/2021 | Cristescu |
| 2021/0073633 A1 | 3/2021 | Hashimoto |
| 2021/0125070 A1 | 4/2021 | Wang |
| 2021/0271973 A1 | 9/2021 | Zhang |

FOREIGN PATENT DOCUMENTS

| | | |
|---|---|---|
| WO | WO 2019/029785 | 2/2019 |
| WO | WO 2019146189 | 12/2020 |

OTHER PUBLICATIONS

Mallick et al., "Number of Parameters and Tensor Sizes in a Convolutional Neural Network (CNN)," https://learnopencv.conn/number-of-parameters-and-tensor-sizes-in-convolutional-neural-network/, May 22, 2018, 12 pages.

International Preliminary Report on Patentability in International Application No. PCT/US2020/047215, dated Mar. 3, 2022, 8 pages.

International Search Report and Written Opinion in International Application No. PCT/US2020/047215, dated Dec. 14, 2020, 15 pages.

\* cited by examiner

GENERAL PADDING SUPPORT FOR CONVOLUTION ON SYSTOLIC ARRAYS

CROSS REFERENCE TO RELATED APPLICATION

This application is a continuation of U.S. application Ser. No. 16/548,555 filed Aug. 22, 2019. The disclosure of the prior application is considered part of and is incorporated by reference in the disclosure of this application.

BACKGROUND

This specification relates to implementing neural networks on systolic arrays.

Neural networks are machine learning models that employ one or more layers to generate an output, e.g., a classification, for a received input. Some neural networks include one or more hidden layers in addition to an output layer. The output of each hidden layer is used as input to another layer in the network, e.g., the next hidden layer or the output layer of the network. Each layer of the network generates an output from a received input in accordance with current values of a respective set of parameters.

SUMMARY

This specification describes techniques for providing general padding support for convolution computation on systolic arrays in a convolution processing system. The system creates a memory view in a scratchpad memory that is consistent with an unpadded input data view in a main memory. By coordinating the memory views in the scratchpad memory and the main memory, the processing system dynamically calculates whether a portion of the transferred data in the scratchpad memory is in the unpadded view of the main memory, and applies padding values to the unpadded data view where a convolution computation is being performed.

More particularly, the techniques include dynamically striding the input data from main memory to the scratchpad memory based on the part of the input data being transfer. The striding of input data can be done by striding the scratchpad memory access and changing of the DMA size for data transfer between the memories. Further, the coordination of the memory view includes coordinating the top left corner of a memory view in the scratchpad memory to an unpadded true memory view in the main memory, to determine if they are in bounds with each other. If the memory view data in the scratchpad memory is out of bounds, the system will replace the values loaded from scratchpad memory with padding values.

Compared to the padded input data transfer from the main memory to the matrix multiplication unit, the system utilizes the faster data transfer from scratchpad memory to the matrix multiplication unit and thus improves the system performance for convolution computation when performing the operations of Convolutional Neural Networks (CNNs). The techniques further improve the usage of the scratchpad memory to support the convolution computation in the matrix multiplication unit, reduce the memory consumption in the main memory for storing the input data with various machine learning models, and make it easier to avoid using the matrix multiplication unit on data that entirely filled with padding data. Not needing to use the matrix multiplication unit on only padding data prevents the matrix multiplication from performing unnecessary computations and reduces the time and multiplication unit usage required to perform a convolution with padded data. The system provides general padding support for convolution computation on multiple frameworks.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Convolutional neural networks are a class of feed-forward neural networks that include one or more convolutional neural network layers and that are suited for operations and computations on two-dimensional data such as images. Convolutional neural network layers are similar to ordinary, e.g., fully-connected, neural network layers and are made up of neurons that have weights and biases. The neurons in convolutional neural network layers receive inputs and perform a dot product that followed by a non-linearity.

Convolutional neural networks usually start with a convolutional layer and include multiple intermediate convolutional layers. In a convolutional neural network, a convolution is a linear operation that involves the multiplication of a set of weights with the input feature data. For example, for a two-dimensional input feature data, the multiplication is performed between an array of input data and a two-dimensional array of weights (a filter). The filter may be smaller than the input data and the type of multiplication applied between a filter-sized patch of the input and the filter is a dot product. In some implementations, having a filter smaller than the input allows the same filter (set of weights) to be multiplied by the input array multiple times at different points on the input. Specifically, the filter is applied systematically to each overlapping part or filter-sized patch of the input data, for example, from left to right, and from top to bottom. In the convolutional layer, the output from multiplying the filter with the input feature data is a single value. As the filter is applied multiple times to the input feature data, the result is a two-dimensional array of output values that represent a filtering of the input feature data.

In some implementations, the layers of the neural network are arranged in a sequence. In some other implementations, the layers are arranged as directed graph. That is, any particular layer can receive multiple inputs, multiple outputs, or both. The layers of the neural network can also be arranged such that an output of a layer can be sent back as an input to a previous layer.

The hyper parameters of a convolutional layer include kernel size, stride, and padding. The kernel size represents the receptive field of the convolution operation that is performed by the layer. For example, in a two-dimensional convolution, the kernel size may be defined as 2×2. Stride is the number of pixels shifted over the input tensor and controls how the kernel convolves around the input data. When the stride is setup to be 1, the kernel convolves around the input data volume by shifting one unit at a time. Padding is a process that is applied to the border of the input data to help control the spatial size of the output and preserve the information on the input data border. For example, applying a 5×5 filter to a 32×32 input volume with stride of 1, the output volume will be 28×28 due to the spatial dimensions decrease after the convolution computation. In the early layers of the neural network and many other cases, it is preferred to preserve as much information about the original input volume as possible so that the low-level features can be extracted. For that purpose, zero padding may be applied with size 2 to the aforementioned 32×32 input volume. In this case, zero padding pads the input volume with zeros around the input data, for example, the input tensor border, and results in a 36×36 input volume. The convolution of the padded input volume to the 5×5 filter with stride of 1 results in a 31×31 output volume with less output dimension shrinking and information loss on the corner of the input data. Generally, a tensor is an ordered collection of numeric values that has a rank that defines the number of dimensions in the tensor. For example, a scalar value is a tensor of rank zero, a vector is a tensor of rank one, a matrix is a tensor of rank two, and so on.

Machine learning models implemented in different frameworks (e.g. PyTorch, tensorflow, or caffe), have different default configurations for padding. For example, when a single raw or column padding is needed, the default padding configuration in caffe is adding zeros to the left or top of the tensor. In contrary, the default padding configuration in TensorFlow is adding zeros to the right or bottom of the tensor. Furthermore, the default padding configuration in PyTorch is adding zeros at all borders of input tensor. In another example, the memory loads as well as padding support from main memory to memory unit on the matrix multiplication engine can vary as well. The aforementioned various padding configurations for convolution computation in different frameworks may cause different system performance. In addition, a domain-specific compiler may be configured to support all types of frameworks at nearly peak performance on various hardware architectures. As a result, a general padding support for convolution computation is needed for performance portability to support the system peak performance on various frameworks and hardware architectures.

Figure 1:
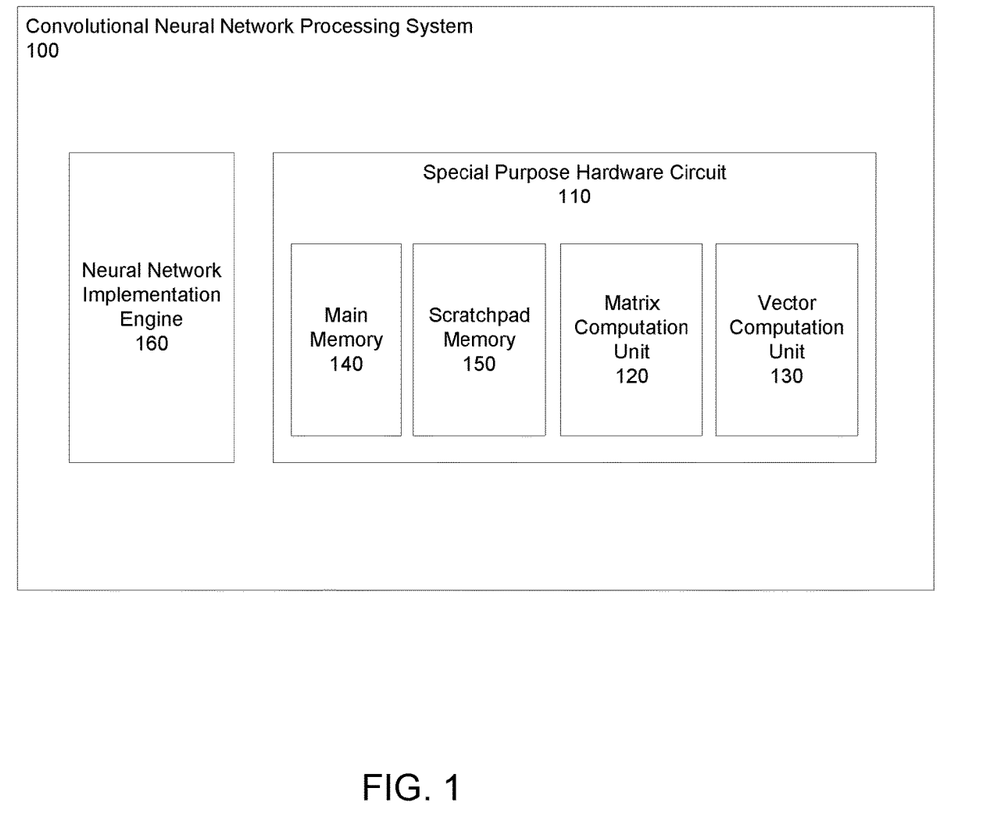
FIG. 1 shows an example convolutional neural network processing system.

FIG. 1 shows an example convolutional neural network processing system 100. The convolution neural network processing system 100 is an example of a system implemented as one or more computers in one or more locations in which the systems, components, and techniques described below can be implemented.

The convolutional neural network processing system 100 is a system that performs neural network computations using a special purpose hardware circuit 110. The special purpose hardware circuit 110 is an integrated circuit for performing neural network computations and includes a matrix computation unit 120 that performs matrix multiplications in hardware. The special purpose hardware circuit 110 also includes a vector computation unit 130 that performs vector multiplications in hardware. An example special purpose hardware circuit 110 is described in more detail below with reference to FIG. 3.

The special purpose hardware circuit 110, as shown in FIG. 1, includes main memory 140 and scratchpad memory 150. The main memory 140 stores an input data to the neural network. The main memory 140 may also transfer an input feature data from outside of the special purpose hardware circuit 110, for example, from a data bus line or an off chip computer storage media. In addition, the main memory 140 is usually configured to have a larger storage volume compared to the scratchpad memory 150, and transfers data to and from the scratchpad memory 150.

The scratchpad memory 150 is a high-speed internal memory used for temporary storage of calculations, data and other work in progress. In the convolutional neural network processing system 100, the scratchpad memory 150 is configured to store a small volume of data for rapid retrieval by the matrix computation unit 120 and vector computation unit 130 in the neural network computations. The scratchpad memory 150 can be considered as the next closest memory to the matrix and vector computation units, often using direct memory access (DMA) based data transfer to move data from memories to the computation units on the hardware circuit 110.

The scratchpad memory 150 may include an array of SRAM cells and a portion of the global memory address space of the special purpose hardware circuit 110 dedicated to the scratchpad memory 150. In the neural network computation, any address that falls in the dedicated address space can directly index into the scratchpad memory 150 to access the corresponding data. Thus, the scratchpad memory 150 is power-efficient as compared to caches, and has been configured to be used in accelerator hardware design due to energy-efficiency, timing predictability and scalability in neural network computations.

In some implementations, the convolutional neural network processing system 100 receives requests to implement neural networks on the special purpose hardware circuit 110, implements the neural networks on the special purpose hardware circuit 110, and, once a given neural network is implemented, processes inputs to the neural network using the special purpose hardware circuit 110 to generate neural network inferences.

That is, the convolutional neural network processing system 100 can receive a request that specifies a neural network architecture for a neural network that is to be used to process inputs. The neural network architecture defines the number and configuration of layers in the neural network and values of the parameters for each of the layers that has parameters.

To implement a neural network on the special purpose hardware circuit 110, the convolutional neural network processing system 100 includes a neural network implementation engine 160 that is implemented as one or more computer programs on one or more computers in one or more physical locations.

The neural network implementation engine 160 generates instructions that, when executed by the special purpose hardware circuit 110, cause the special purpose hardware circuit 110 to perform the operations specified by the neural network to generate a neural network output from a received neural network input.

Once the instructions have been generated by the neural network implementation engine 160 and provided to the special purpose hardware circuit 110, the convolutional neural network processing system 100 can receive neural network inputs and process the neural network inputs using the neural network by causing the special purpose hardware circuit 110 to execute the generated instructions.

As described above, convolutional layers in a neural network specify a convolution computation on a neural network matrix, e.g. an input feature, with a filter matrix that produces a feature output. Some neural networks specify two types of results to the convolution computation. In the first type, with no padding applied to the input feature, the convolved feature is reduced in dimensionality as compared to the input. In the second type, with padding applied to the input feature, the convolved feature is either increased or remains the same in dimensionality as compared to the input. For example, the input feature may be padded by zeros in the border where the filter would access elements which do not exist in the input feature. This padding can, e.g., result in input feature edge elements being detected at the border of the input feature if the border pixels are not black.

The main hardware units that perform matrix operations on the special purpose hardware circuit 110 are the matrix computation unit 120 and the vector computation unit 130. To implement a neural network that specifies a convolution computation on a matrix, the neural network implementation engine 160 generates instructions that, when executed by the special purpose hardware circuit 110 during processing of a neural network input by the neural network, cause the special purpose hardware circuit 110 to perform a convolution operation on the matrix using the matrix computation unit 120 and the vector computation unit 130. In this example, the system 100 utilizes the scratchpad memory 150 to effectively account for various padding schemes that may be employed to pad input features in different frameworks. In particular, this example includes coordinating the top left corner of the portion of a scratchpad memory data to a memory view data in the main memory 140, determining if all the portion of the scratchpad memory data is in bounds of the memory view data in the main memory 140, and then applying padding values to the scratchpad memory data. These instructions and operations are described in more detail below with reference to FIGS. 4-7.

Figure 2:
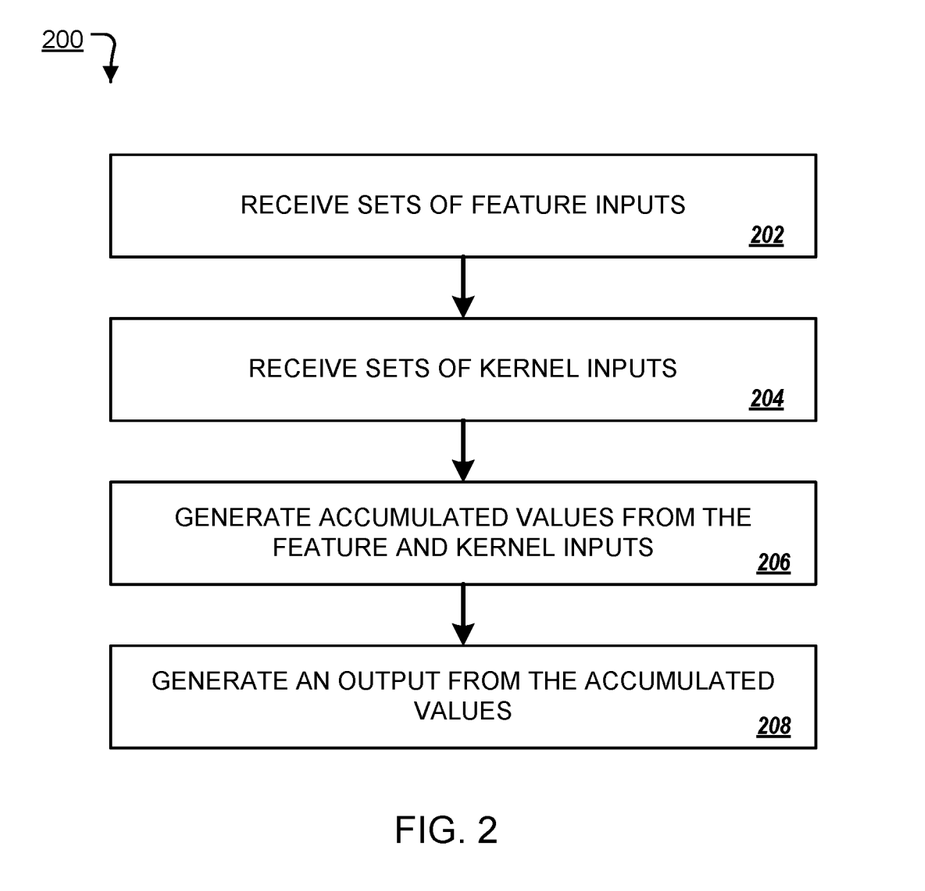
FIG. 2 is a flow diagram of an example process for performing a computation for a convolutional layer of a neural network.

FIG. 2 is a flow diagram of an example process 200 for performing a computation for a convolutional layer of a neural network using a special purpose hardware circuit 110. For convenience, the process 200 will be described with respect to a system having one or more circuits that performs the process 200. The process 200 can be performed for each convolutional layer of the neural network in order to compute an inference or training from a received input.

The convolutional neural network processing system 100 receives sets of input features, e.g. images (step 202) and sets of kernel inputs, e.g. linear image filters (step 204) for the given convolutional layer. The sets of input features and the sets of kernel inputs can be received by and stored in the main memory 140 and scratchpad memory 150 separately, on the special purpose hardware circuit 110. In some implementations, both the sets of weight inputs and the sets of activation inputs may be received by and stored in the main memory 140.

The convolutional neural network processing system 100 generates accumulated values from the input features and the input filter using the matrix computation unit 120 of the special purpose hardware circuit 110 (step 206). In some implementations, the special purpose hardware circuit 110 selects the input feature data and performs an elementwise multiplication with a corresponding filter data, and then sum up the computing results to a single output element. The special purpose hardware circuit 110 repeats the process for every location that it strides over on the input feature, and then delivers the output elements to the vector computation unit 130.

The convolutional neural network processing system 100 can generate a layer output from the accumulation values (step 208) using a vector computation unit 130 of the special purpose hardware circuit 110. The output of the layer can be stored in the scratchpad memory 150 for use as an input to a subsequent layer in the neural network or can be used to determine the inference, i.e., the final output of the neural network. The system finishes processing the neural network when a received input has been processed through each layer of the neural network to generate the inference or training output for the received input.

Figure 3:
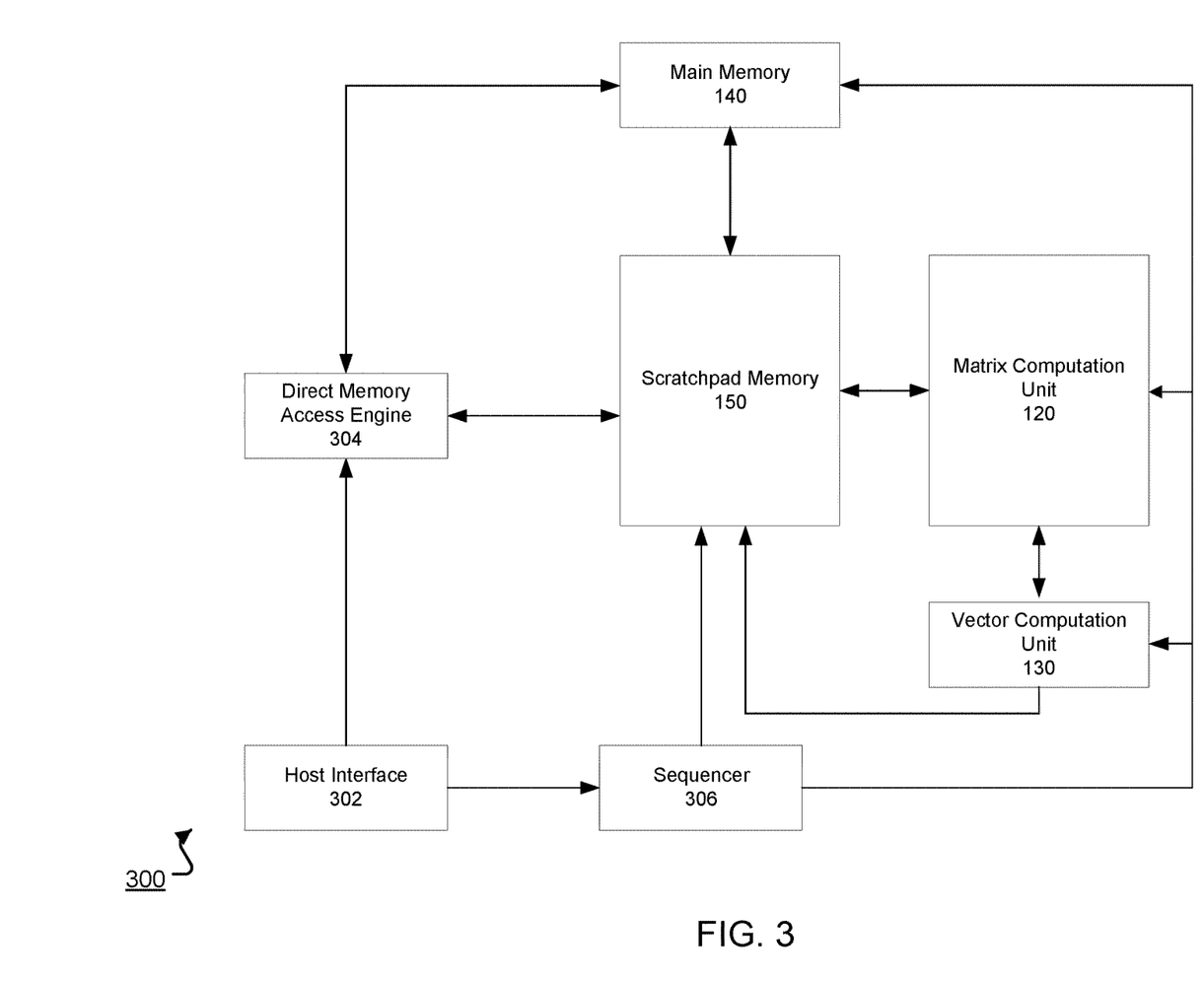
FIG. 3 shows an example neural network processing system.

FIG. 3 shows an example neural network processing system 300. In particular, FIG. 3 shows an example of special purpose hardware system 300 for performing padding for neural network convolution computations. The system 300 includes a host interface 302. The host interface 302 receives and delivers instructions that include parameters for a neural network computation. The parameters may include one or more of the following: the number of neural network layers to be processed, corresponding sets of weight inputs for each layer of the neural network, an initial set of input features, i.e., the input to the neural network from which the convolution is to be computed, corresponding input and output sizes of each convolutional layer, a stride value for any given convolutional layer, and a type of layer to be processed, e.g., a convolutional layer or a fully connected layer.

The host interface 302 can send the instructions to a sequencer 306, which converts the instructions into low level control signals that control the circuit to perform the neural network computations. In some implementations, the control signals regulate dataflow in the circuit, e.g., how the sets of feature inputs and the sets of filter inputs flow through the circuit. The sequencer 306 can send the control signals to the scratchpad memory 150, the matrix computation unit 120, the main memory 140, and a vector computation unit 130. In some implementations, the sequencer 306 is a processor that generates control signals. The sequencer 306 can use timing of the control signals to, at appropriate times, send the control signals to each component of the special purpose hardware system 300. In some implementations, the sequencer 306 can issue comparison instructions to both of the scratchpad memory 150 and main memory 140 and compare the stored information, respectively. In some other implementations, the host interface 302 passes in a control signal from an external processor.

The host interface 302 can send the sets of feature inputs and the sets of filter inputs to the direct memory access (DMA) engine 304. The DMA engine 304 can store the sets of feature and filter inputs at the scratchpad memory 150. In some implementations, the direct memory access stores the sets of filter inputs to main memory 140. In some implementations, the main memory 140 is located off of the special purpose hardware circuit 110.

The scratchpad memory 150 is a high-speed internal memory used for temporary storage of calculations, data and other work in progress. In the special purpose hardware system 300, the scratchpad memory 150 can be used to store a portion of the set of feature and filter inputs from the DMA engine 304 and outputs of the vector computation unit 314. The scratchpad memory is usually the only memory directly available to the matrix computation unit and vector computation unit. In order to access data in the main memory or off-chip memory, a processor must issue explicit DMA requests. DMA is configured to transfer large amounts of data between memory locations without processor intervention and hence offers additional level of parallelism by overlapping computations and data prefetching. The data transfer between main memory 140 and scratchpad memory 150 will be described in more detail below with reference to FIGS. 4 and 5. The direct memory access engine 304 can also read the outputs of the vector computation unit 314 from the scratchpad memory 150.

In some implementations, the scratchpad memory 150 and the main memory 140 can send the sets of input features and the sets of filter inputs, respectively, to the matrix computation unit 120. In some implementations, the matrix computation unit 120 is a two-dimensional systolic array. The matrix computation unit 120 can also be a one-dimensional systolic array or other circuitry that can perform mathematical operations, e.g., multiplication and addition. In some implementations, the matrix computation unit 120 is a general purpose matrix processor. The special purpose hardware system 300 can use matrix computation unit 120 to perform matrix multiplication operations for convolutional computation.

The matrix computation unit 120 can process the input features and the filter inputs, and provide a convolution computation result as output to the scratchpad memory 150. In some implementations, the convolution output may be transferred to the scratchpad memory 150 through the vector computation unit 130 with additional features, i.e. activation functions. In some implementations, the convolution output, i.e. a two-dimensional matrix, is stored in the scratchpad memory 150 in a form of a set of vectors. The set of vectors can be generated along one dimension of the matrix computation unit 120, i.e. the row of the matrix computation unit 120. In some implementations, the convolution output can be configured as feature inputs to the matrix computation unit 120, e.g., for use in a subsequent convolutional layer in the neural network.

In this example, the input features data is stored in the main memory 140 and the neural network processing system 300 creates a memory view in the scratchpad memory 150 that is consistent with an unpadded input features data view in the main memory 140. The sequencer 306 coordinates the memory views in the main memory 140 and the scratchpad memory 150 to dynamically calculate whether a portion of the data in scratchpad memory 150 is in the memory view. The neural network processing system 300 then applies the padding value to the unpadded memory view in the scratchpad memory 150, and transfer the padded memory view to the matrix computation unit 120 for convolution computation.

Figure 4:
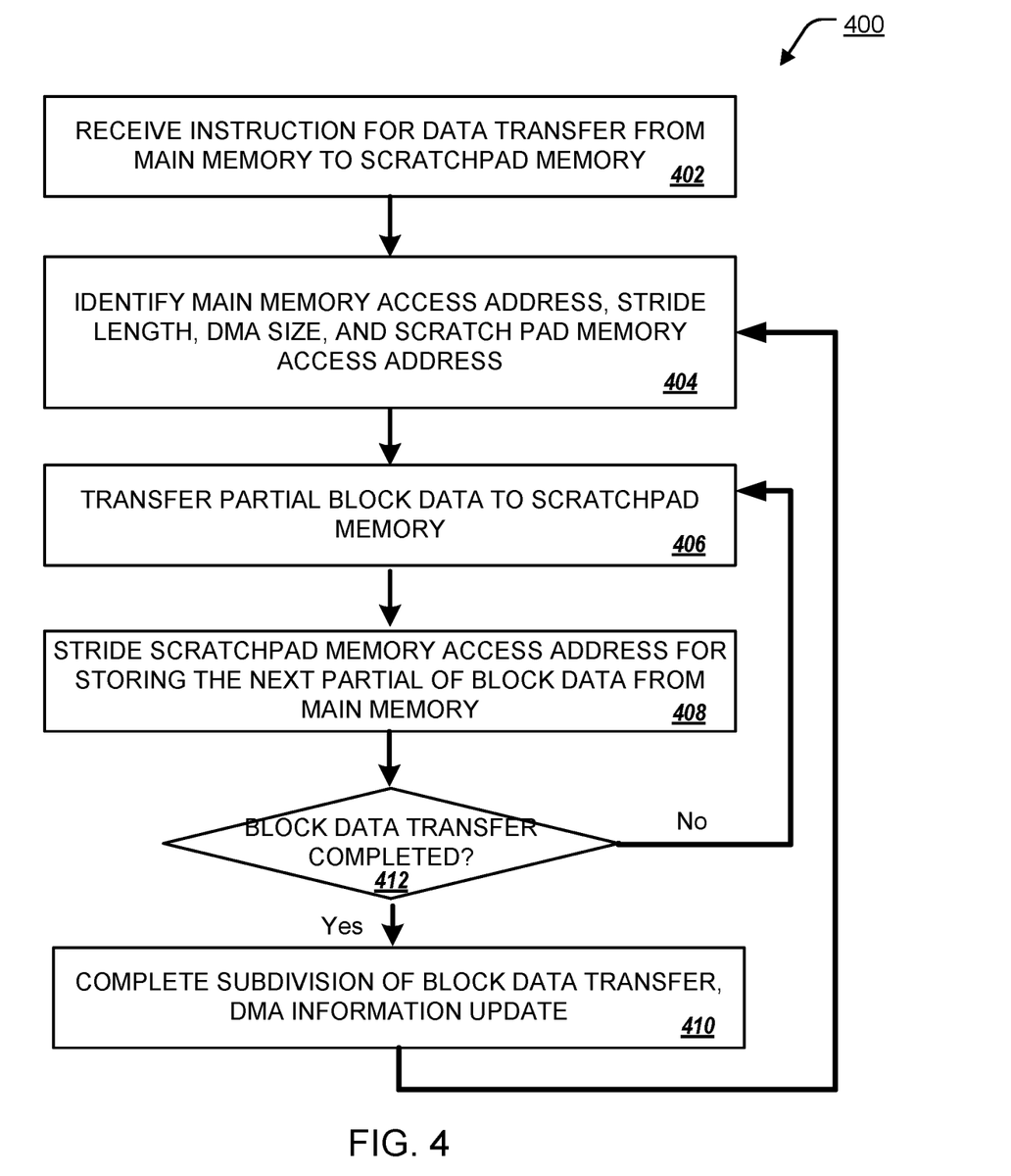
FIG. 4 is a flow diagram of an example process for performing main memory to scratchpad data stride transfer.

FIG. 4 is a flow diagram of an example process 400 for performing main memory to scratchpad data stride transfer. In particular, FIG. 4 shows an example process 400 for creating a memory view in the scratchpad memory 150 that is consistent with an unpadded view in the main memory 140. For convenience, the process 400 will be described with respect to a system having one or more circuits that performs the process 400. The process 400 can be performed on each convolutional layer of the neural network in order to compute an inference or training from a received input.

The system 100 receives instructions from the host interface 302 to conduct the convolution computation on a specific convolutional layer in the convolutional neural network processing system 100. In particular, the host interface 302 sends operation instructions to create a memory view in the scratchpad memory 150 that is consistent with an unpadded input feature data, i.e. an unpadded kernel input in a two-dimension matrix, in the main memory 140 (step 402). The main memory 140 stores the input features and filter inputs for the convolutional computation in the special purpose hardware circuit 110. In some implementations, the input features may be sets of image pixel data and the filter inputs may be sets of filter matrixes.

The system 100 identifies the access address of the input feature data on the main memory 140, the stride length of shifting the data transfer from the main memory 140, the DMA size, and the scratchpad memory 150 access address for storing the transferred input feature data (step 404). In this example, the transfer of the input feature data from the main memory 140 to the scratchpad memory 150 is configured to be consistent. However, the data storage configuration may not be identical between the main memory 140 to the scratchpad memory 150. As a result, the address of storing the sub-blocks of input feature data in the scratchpad memory 150 needs to be updated, in order to keep a same memory view of input feature date between the main memory 140 to the scratchpad memory 150. As a result, the scratchpad memory 150 access address is updated after each stride to the input feature data on the main memory 140, so that the transferred memory data view in the scratchpad memory 150 is matched to the unpadded memory view in the main memory 140. In some implementations, at the initial cycle of the memory view data transfer, the access address of the main memory 140 is the starting storage address of the input features on the main memory 140. During the memory view transfer, the access address of the main memory 140 may be updated based on the stride length from shifting the memory view from current block of input features data to the next block of input features data. In some implementations, the DMA size is configured to match with the filter size for convolution computation. In some implementations, the DMA size is optimized to minimize the number of data transfers from the main memory 140 to the scratchpad memory 150. For example, for a filter data with 1050 pixels, the DMA size may be configured to be 525 pixels to complete the data transfer in two cycles. In another example, for a filter data with 1050 pixels, the DMA size may be configured to be 350 pixels to complete the data transfer in three cycles.

The system 100 transfers the memory view data from the main memory 140 to the scratchpad memory 150 in DMA (step 406). In some implementations, the matrix computation unit 120 may be configured as two-dimensional systolic arrays and the data transfer from main memory 140 to scratchpad memory 150 using DMA of data blocks may be required. In some implementations, the input features, e.g. an image pixel matrix may be split into many contiguous submatrices blocks and then transferred to the scratchpad memory 150.

In order to transfer or copy data from the main memory 140 to the scratchpad memory 150, the host interface 302 issues instructions to the DMA engine 304 that takes charge of the data transfer. Such instructions may include a source data read address in the main memory 140, a destination data store address in the scratchpad memory 150, and a block size. When the instruction is received, the data transfer begins and the input features are divided into smaller submatrix blocks that transfer from the main memory 140 to the scratchpad memory 150 through on board interconnections. The duration of the data transfer phase is proportional to the amount of data and limited by the bandwidth of the on board interconnections.

In some implementations, the host interface 302 sends instructions to DMA for non-contiguous but regularly structured block data transfer from the main memory 140 to the scratchpad memory 150. The non-contiguous block data transfer may be performed using strided DMA instructions that specify the stride which is an offset to access the next contiguous block in the main memory 140, in addition to the main memory and scratchpad memory addresses. The non-contiguous block data transfer may benefit the convolutional computation efficiency and convolutional neural network processing system 100 performance.

The system 100 strides the storage address on scratchpad memory 150 for unpadded memory view data that transferred from the main memory 140 to the scratchpad memory 150 in the next iterations (step 408). The system iterates steps 404, 406, 412 and 408 to transfer all the unpadded input feature data from the main memory 140 to the scratchpad memory 150. The system iterates steps 404, 406, 412, 408 and 410 to transfer all the input features data from the main memory 140 to the scratchpad memory 150, for the convolutional neural network computations.

In this example, the padding of input feature data executes in the scratchpad memory 150. Once the unpadded memory view of input feature data is transferred from the main memory 140 to the scratchpad memory 150, the sequencer 306 can issue coordination instructions to both of the scratchpad memory 150 and main memory 140 and compare the stored input feature data. Based on the comparison results, the system 100 performs padding on the input feature data stored in the scratchpad memory 150. The configured padding on scratchpad memory 150 reduces the main memory consumption as the input feature data is only being written and transferred once from the main memory 140 to the scratchpad memory 150. The consistent memory view of input feature data stored in the scratchpad memory 150 can be revisited as input kernel to the convolution computation in the matrix computation unit 120. The revisiting of memory view data in scratchpad memory 150 improves the system 100 performance as its communication to the matrix computation unit 120 is faster than that of the main memory 140. Furthermore, the main memory consumption may be reduced by avoiding the materialization of padded memory view of the data in main memory 140. These instructions and operations are described in more detail below with reference to FIGS. 6-7.

Figure 5:
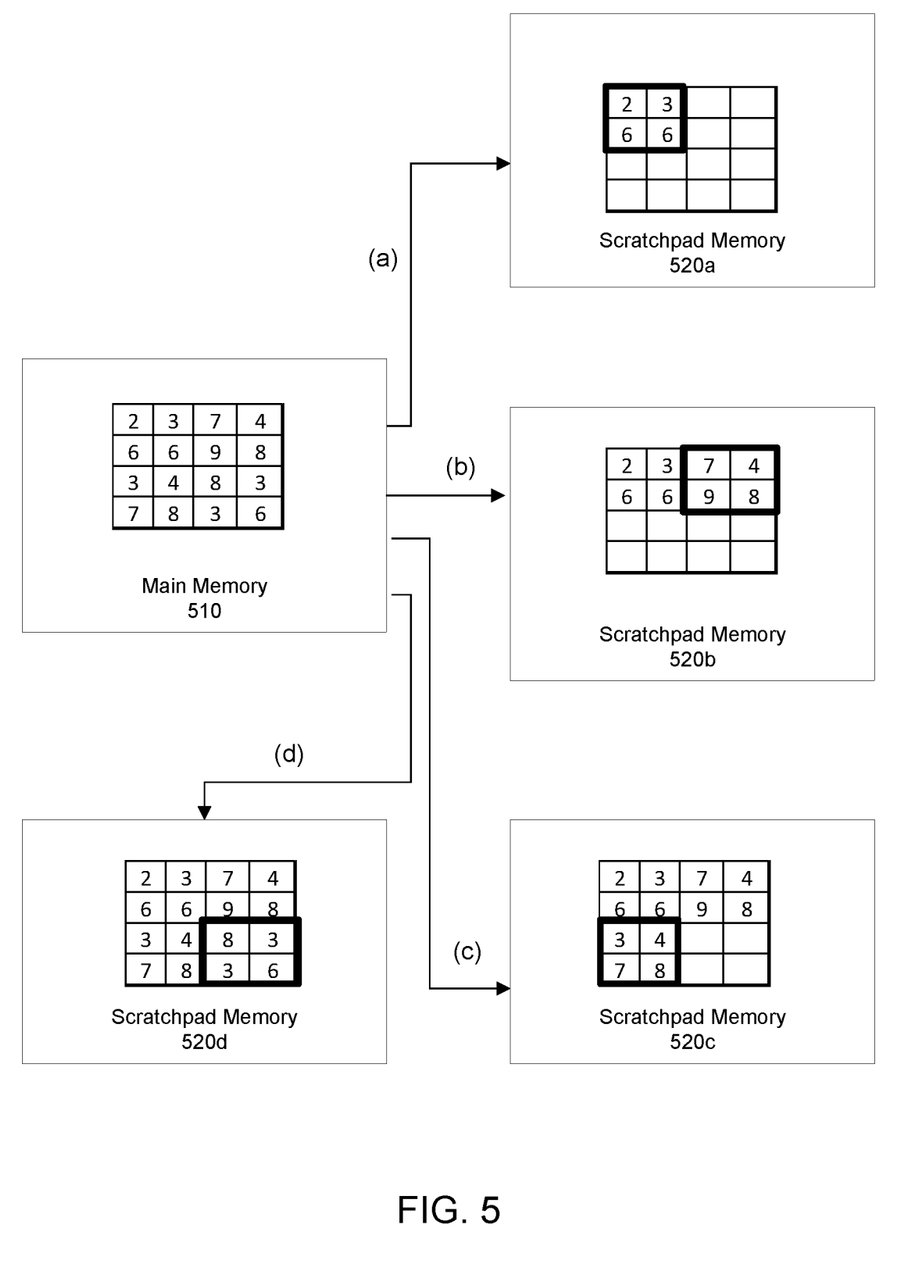
FIG. 5 is an example of data transfer from main memory to scratchpad memory with consistent memory view.

FIG. 5 is an example of data transfer from main memory 140 to scratchpad memory 150 with consistent memory view. This example may be performed using the example process 400 of FIG. 4 and the special purpose hardware system 300 of FIG. 3.

In this example, the input feature is a 4×4 matrix stored in the main memory 510. The host interface 302 sends operation instructions to create a memory view in the scratchpad memory 150 that is consistent with the unpadded input feature data memory view in the main memory 140. The DMA engine 304 identifies the main memory access address as the first input feature element address on the main memory 140. The DMA engine 304 also identifies the size of the data that to be transferred to the scratchpad memory 150 in each iteration of the operations, and the initial access address of the scratchpad memory 150 to store the transferred data. In this example, the input feature is split into smaller block size of 2×2 matrix for the consistent memory view data transfer.

In stage (a) of FIG. 5, the special purpose hardware circuit 110 forms a current subdivision of a 4×4 matrix by splitting the entire input feature matrix to two subdivision matrices. The first subdivision matrix 2 3
6 6 is transferred to the scratchpad memory 150 in a same memory view without any padding. The first transferred subdivision matrix is stored at the pre-identified access address of the scratchpad memory 150. In some implementations, elements on the first row of the subdivision matrix are firstly transferred and stored contiguously at the access address of the scratchpad memory 150. In this example, the input feature data elements [2, 3] on the first row of the subdivision matrix are transferred and stored contiguously at the initial access address of the scratchpad memory 150. In order to maintain a consistent memory view of the input feature data on the main memory 140 and the scratchpad memory 150, the memory access on the scratchpad memory 150 is strided before transferring the second row of the subdivision matrix data from the main memory 140 to the scratchpad memory 150. In this example, the second row elements of the input feature data [6, 6] on the subdivision matrix are stored on the strided address of the scratchpad memory 150, as shown in scratchpad memory 520a. After two iterations of sending row data, the first subdivision matrix is transferred to the scratchpad memory 150 with the same memory view as that in the main memory 140.

Stage (b) of FIG. 5 depicts transferring the second subdivision matrix 7 4
9 8 from the main memory 140 to the scratchpad memory 150 in a consistent memory view. The system 100 updates the access address of the main memory 140 to the address of the leading data element of the second subdivision matrix. The system also updates the access address of the scratchpad memory 150 to mirror to the second subdivision matrix memory view in the scratchpad memory 150. The DMA engine 340 identifies a same data size for transfer compared to that in the previous stage (a). In some implementations, the first row data elements of the second subdivision matrix [7, 4] are firstly transferred to the scratchpad memory 150. The access address is strided once the first raw data are stored in the scratchpad memory 320b, and before the beginning of the second row data elements transfer. In the next step, the second row data elements of the subdivision matrix [9, 8] are transferred to the strided access address of the scratchpad memory 150, and then completes the second subdivision matrix data transfer with consistent memory view between the main memory 140 and the scratchpad memory 150.

Similarly to stage (a) and (b), the system 100 continuously transfers the third subdivision matrix in stage (c) and the fourth subdivision matrix in stage (d) to the scratchpad memory as shown on 520c and 520d, respectively, to complete the whole input feature data transfer from the main memory 140 to scratchpad memory 150 in a consistent memory view.

In this example, the input feature data is transferred from the main memory 140 to the scratchpad memory 150 in a consistent memory view. This is done by striding the memory access in the scratchpad memory 150, and changing the size of the DMA in the memory data transition. The consistent memory view in the scratchpad memory 150 enables the padding configuration to the input feature data for convolution computation.

Figure 6:
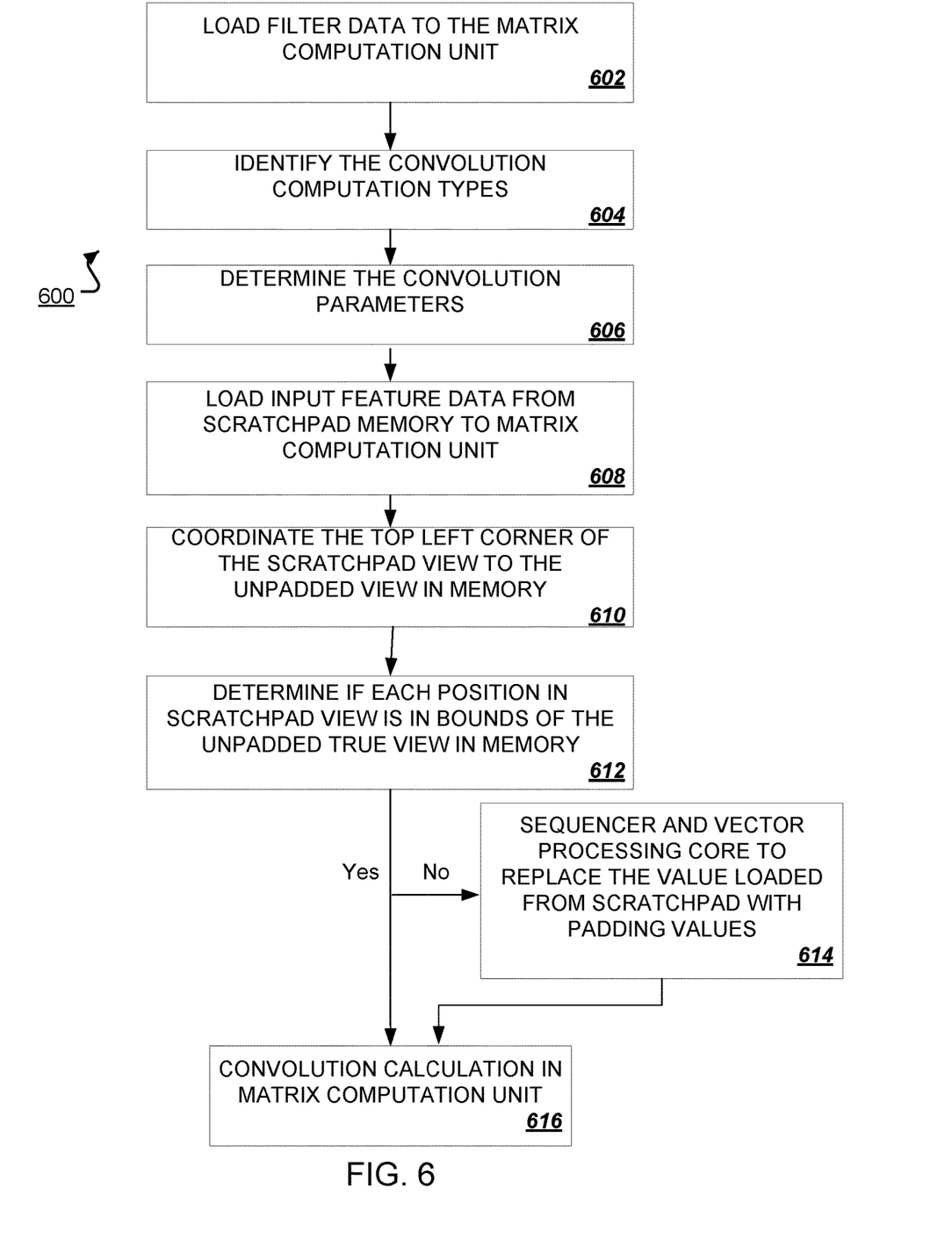
FIG. 6 is a flow diagram of an example method for performing padding on scratchpad memory data for convolutional computation.

FIG. 6 is a flow diagram of an example process 600 for performing padding on scratchpad memory data for convolutional computation in the convolutional neural network processing system 100. Generally, the process 600 is performed by a system of one or more computers that includes a special-purpose hardware circuit (e.g., special purpose hardware circuit 110 of FIG. 1).

The special purpose hardware circuit 110 receives an instruction from the host interface 302 to load the kernel filter data, e.g. a two dimensional matrix, to the matrix computation unit (step 602). In particular, the instruction includes the location information of kernel data that stored in the matrix computation unit 120.

The special purpose hardware circuit 110 identifies the type of convolution computation in a specific convolutional neural network layer (step 604). In some implementations, the convolutional computation focuses on the high level of the input feature characters and conducts valid convolution without using any padding of the input feature. In some implementations, the input feature data has additional padded values at the border to generate an output of the convolution computation that has the same dimension of the input features. This type of convolution is defined as a "same convolution" and always requires padding of the input data.

The special purpose hardware circuit 110 determines the convolution parameters (step 606). The convolution parameters include, for example, a padding number, a size of input, a size of output, a size of kernel used in the convolutional layer, a number of kernels, and a stride length of the convolution operation.

The special purpose hardware circuit 110 indicates the DMA engine to pad the input feature data that transferred from the scratchpad memory 150 to the matrix computation unit 120, e.g. a two-dimensional systolic array (step 608). The input feature data may be stored in the matrix computation unit in a way that matches to the pre-stored filter data for convolution computation. For example, a two-dimensional filter data matrix may be pre-loaded to the processing units of the matrix computation unit 120. The input feature data, for example, a padded submatrix block of input feature data stored in the scratchpad memory 150, can be transferred to the same processing units of the matrix computation unit 120 as that of the filter data, for the convolution computation.

The special purpose hardware circuit 110 supports general padding to the convolution computation in the convolutional neural network layer. The sequencer 306 coordinates to compare the top left corner of the scratchpad data, e.g. a two-dimensional matrix that loaded in the matrix computation unit 120 for convolution computation, to the data view in main memory (610).

The convolutional neural network processing system 100 determines if each position of the input feature data in scratchpad view is in bounds of the unpadded input feature view in the main memory 140 (612). When the top left corner of the scratchpad data bounds to the unpadded data view in the main memory 140, the system 100 orders the matrix computation unit 120 to execute the matrix computation and then vector accumulation in the vector computation unit 130 to complete the convolution computation (step 616).

When the top left corner of the scratchpad data does not bound to the unpadded input feature data view in the main memory 140, the sequencer core and vector computation unit are instructed by the system to replace the non-bounded values on the scratchpad memory 150 with padding values (step 614).

There are various methods of padding values to the input feature data at the matrix computation unit 120. One example padding technique is zero-padding which means pad zero values to the border of the input feature. In another example, the existing values pre-stored in the scratchpad memory 150 and near the outside border of the input feature can be selected as values for padding. In some other examples, the values that stored in the opposite position of the input feature matrix, for example, the data stored in the bottom right of a two-dimensional matrix can be used as padding values at the top left of the two-dimensional matrix. The padded input feature data is updated in the matrix computation unit for convolution computation.

Figure 7:
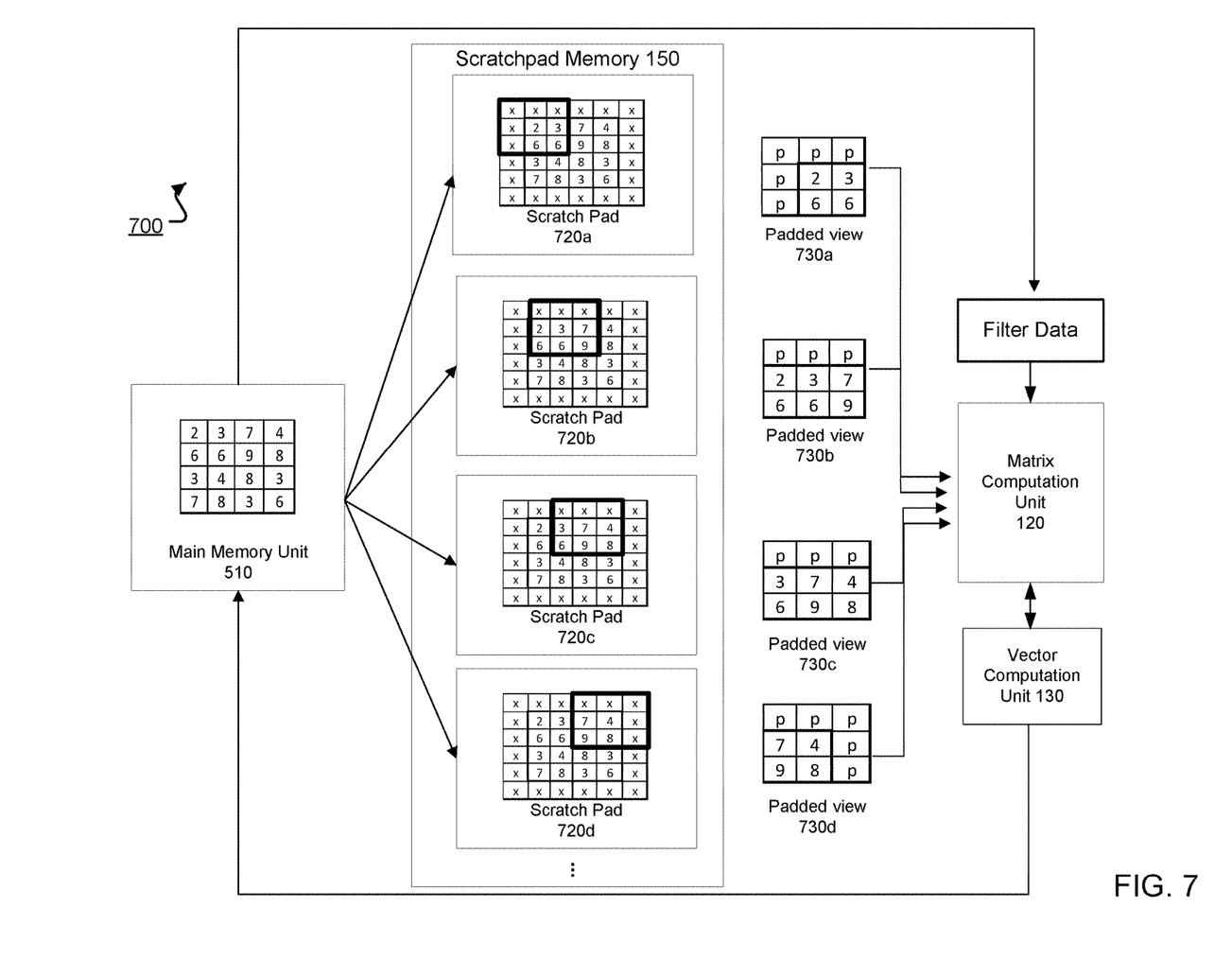
FIG. 7 is an example of scratchpad memory data padding for performing a convolution operation on a neural network layer.

FIG. 7 is an example of input feature data padding in the scratchpad memory 150 for performing a convolution computation on a convolutional neural network layer. This example may be performed using the process of FIG. 6 and the special purpose hardware system 300 of FIG. 3.

In the first stage of the this example, similar to the aforementioned input feature data transition in FIG. 5, the input feature data is transferred from the main memory 140 to the scratchpad memory 150. In this example, the input feature data is transferred and stored as a 4×4 matrix 510 in the scratchpad memory 150. The border values that labeled in "x" and around the edge of the 4×4 matrix are pre-stored existing data in the scratchpad memory 150 and may not be relevant to the input feature data.

In the next stage of the example, the type of the convolution and the convolution parameters are determined by the special purpose hardware circuit 110. In this example, the convolution is a same convolution and requires padding on the input feature data for the convolutional computation. In particular, the padding is determined to be 1, the stride is determined to be 1, and the size of the padded data as well as the filter data are determined to be a 3×3 matrix.

The padded input feature data on scratchpad memory 150 is shown on 720a-720d. As illustrate earlier, the padding was determined to be 1, and thus the values exists outside of the border of 4×4 matrix are selected as padding values to the input feature data. The existing padding values are labeled as "x" and may be various.

In the next stage of the example, the special purpose hardware circuit 110 indicates the DMA engine 304 to load the selected input feature data, for example, the tope left 3×3 matrix data in 720a, from the scratchpad memory 150 to the matrix computation unit 120 for convolutional computation.

The special purpose hardware circuit 110 utilizes the sequencer 306 on coordinating and comparing the top left corner of the selected scratchpad memory data to the data view in the main memory 140. In this example, the top left corner of the selected 3×3 matrix data in 720a is not matched to the top left corner of the corresponding data view in the main memory 140. The top left corner data in the selected scratchpad memory 150 is determined to be out of bounds of the true memory image and will be replaced by a padding value. In some implementations, zero padding is applied to the convolutional computation, and the special purpose hardware circuit 110 operates the sequencer 306 and vector computation unit 130 to insert zeros to the padded data view. In some other implementations, the special purpose hardware circuit 110 may utilize the existing value x as the padding value while not conducting convolution computation on these padding values.

In the padded view 730a of this example, the top row and left column data have been determined as not bounded to the unpadded true data view in the main memory 140, and replaced by padded values as labeled as "p". The padded data matrix 730a is then being convolutional computed with the filter matrix in the matrix computation unit 120.

The special purpose hardware circuit 110 controls DMA engine 304 on striding the scratchpad data and iterating the comparison of top left corner of the padded scratchpad memory data view with the true image data stored in the main memory 140. As shown in scratchpad view 720b, the scratchpad access is shifted by one column and the second 3×3 matrix is being transferred from the scratchpad memory to the matrix computation unit. The top left corner data element of the scratchpad view data is out of bounds to the top left corner data of the true image data in the main memory 140, and thus replaced by the padding values. In padded view 430b, the top row data is replaced by padded values for convolutional computation in the matrix computation unit 120. The padding values likewise as described in 730a, may be existing values x from the scratchpad memory 150, or zeros inserted from the sequencer 306 and vector computation unit 130.

The special purpose hardware circuit 110 iterates the accessing of the scratchpad memory data, comparison of the padded scratchpad memory data to the true image data in the main memory 140, and updating of the padding values in scratchpad data, until all the input feature data completed the data transferred from the scratchpad memory 150 to the matrix computation unit 120 for convolution computation.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To send for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can send input to the computer. Other kinds of devices can be used to send for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method comprising:
   receiving a request for a neural network on a hardware circuit having a matrix computation unit, a scratchpad memory, and a main memory, the request specifying a convolutional computation to be performed on a feature tensor and a filter; and
   generating instructions that when executed by the hardware circuit cause the hardware circuit to perform operations comprising:
      transferring feature tensor data from the main memory of the hardware circuit to the scratchpad memory of the hardware circuit, wherein transferring the feature tensor data comprises:
         striding a memory access in the scratchpad memory, and
         changing a size of a direct memory access for transfer of the feature tensor data from the main memory to the scratchpad memory; and
      identifying a current subset of the feature tensor, and when the memory view into the scratchpad memory for the current subset is not consistent with the memory view of the current subset in the main memory, loading the current subset of the feature tensor from the scratchpad memory into the matrix computation unit and, during the loading, conducting a general padding on the loaded subset of the feature tensor.

2. The method of claim 1, wherein changing the size of the direct memory access comprises matching the size of the direct memory access to a filter size of the filter.

3. The method of claim 2, wherein the filter comprises an array of weights.

4. The method of claim 1, wherein changing the size of the direct memory access comprises optimizing the size of the direct memory access to minimize a number of data transfers from the main memory to the scratchpad memory.

5. The method of claim 1, comprising computing a matrix computation between the current subset of the feature tensor and the filter using the matrix computation unit.

6. The method of claim 1, wherein the determining whether a memory view into the scratchpad memory for the current subset is consistent with a memory view of the current subset in the main memory comprises:
   coordinating a corner portion of the memory view in the scratchpad memory to the memory view in the main memory; and
   determining if all the portions of the memory view in the scratchpad memory is in bounds of the memory view in the main memory.

7. The method of claim 6, wherein the coordinating a corner portion of the memory view in the scratchpad memory to the memory view in the main memory is performed by a sequencer of the hardware circuit.

8. The method of claim 1, wherein conducting the general padding comprises:
   replacing one or more of values loaded from the scratchpad memory with padded values; and
   utilizing one or more of values that pre-stored in the scratchpad memory and adjacent to the memory view in the scratchpad memory as padded values.

9. The method of claim 1, wherein conducting the general padding further comprises:
identifying a type of convolution computation in a specific convolutional neural network layer;
determining convolution parameters; and
loading the feature tensor data from the scratchpad memory to the matrix computation unit.

10. The method of claim 1, wherein the filter is loaded from the scratchpad memory or the main memory, to the matrix computation unit prior to the loading of the feature tensor data from the scratchpad memory to the matrix computation unit.

11. The method of claim 1, wherein conducting the general padding further comprises:
determining convolution parameters that comprise a padding number, a size of input data, a size of output data, a size of filter data, a number of the filters, and a stride of convolution operation.

12. The method of claim 1, wherein the conducting a general padding is performed by a sequencer and a vector computation unit of the hardware circuit.

13. The method of claim 1, wherein the computing a matrix computation using the matrix computation unit comprises a series of vector multiplication operations.

14. A system comprising a hardware circuit having a matrix computation unit, a scratchpad memory, a main memory, and one or more storage devices storing instructions that are operable, when executed by the one or more computers, to cause the one or more computers to perform operations comprising:
receiving a request for a neural network on the hardware circuit, the request specifying a convolutional computation to be performed on a feature tensor and a filter; and
generating neural network instructions that when executed by the hardware circuit cause the hardware circuit to perform neural network operations comprising:
transferring feature tensor data from the main memory of the hardware circuit to the scratchpad memory of the hardware circuit, wherein transferring the feature tensor data comprises:
striding a memory access in the scratchpad memory, and
changing a size of a direct memory access for transfer of the feature tensor data from the main memory to the scratchpad memory; and
identifying a current subset of the feature tensor, and
when the memory view into the scratchpad memory for the current subset is not consistent with the memory view of the current subset in the main memory, loading the current subset of the feature tensor from the scratchpad memory into the matrix computation unit and, during the loading, conducting a general padding on the loaded subset of the feature tensor.

15. The system of claim 14, wherein changing the size of the direct memory access comprises matching the size of the direct memory access to a filter size of the filter.

16. The system of claim 15, wherein the filter comprises an array of weights.

17. The system of claim 14, wherein changing the size of the direct memory access comprises optimizing the size of the direct memory access to minimize a number of data transfers from the main memory to the scratchpad memory.

18. The system of claim 14, comprising computing a matrix computation between the current subset of the feature tensor and the filter using the matrix computation unit.

19. The system of claim 14, wherein the determining whether a memory view into the scratchpad memory for the current subset is consistent with a memory view of the current subset in the main memory comprises:
coordinating a corner portion of the memory view in the scratchpad memory to the memory view in the main memory; and
determining if all the portions of the memory view in the scratchpad memory is in bounds of the memory view in the main memory.

20. The system of claim 19, wherein the coordinating a corner portion of the memory view in the scratchpad memory to the memory view in the main memory is performed by a sequencer of the hardware circuit.

* * * * *